United States Patent [19]

Wood

[11] Patent Number: 4,700,275
[45] Date of Patent: Oct. 13, 1987

[54] MODULARIZED ELECTRONIC INSTRUMENT PACKAGING SYSTEM

[75] Inventor: Brian J. Wood, Hillsboro, Oreg.
[73] Assignee: Tektronix, Inc., Beaverton, Oreg.
[21] Appl. No.: 877,592
[22] Filed: Jun. 23, 1986
[51] Int. Cl.[4] ............................................. H05K 5/02
[52] U.S. Cl. .................................... 361/393; 211/41; 361/390; 361/394; 361/395; 361/415
[58] Field of Search ............... 361/390, 391, 395, 415, 361/392, 393, 394; 211/41

[56] References Cited

U.S. PATENT DOCUMENTS

| | | | |
|---|---|---|---|
| 3,264,525 | 8/1966 | Swengel et al. | 361/394 |
| 3,265,935 | 8/1966 | Rosa | 361/415 |
| 4,109,294 | 8/1978 | Mason et al. | 361/394 X |
| 4,232,356 | 11/1980 | Saunders et al. | 361/415 |
| 4,277,120 | 7/1981 | Darke et al. | 361/415 X |
| 4,442,476 | 4/1984 | Lenderking et al. | 361/415 X |
| 4,533,793 | 8/1985 | Geppert | 361/415 X |
| 4,597,291 | 7/1986 | Motoyima | 361/395 X |
| 4,620,265 | 10/1986 | Lerude et al. | 211/41 X |

Primary Examiner—R. R. Kucia
Attorney, Agent, or Firm—Allston L. Jones; Robert S. Hulse

[57] ABSTRACT

A modularized packaging system for enclosing circuit components of an electronic instrument. That system includes one or more "C" frame modules each having top, bottom and side wall portions interconnected one to the other orthogonally. In addition, there is provided interconnection means for interconnecting, side by side, as many of the "C" frame modules as desired with a side panel provided for closing the outwardly facing open sides, if any, of the outermost "C" frame modules. To complete the package, front and rear end assemblies are provided to close those portions of the interconnected "C" frame modules.

13 Claims, 3 Drawing Figures

MODULARIZED ELECTRONIC INSTRUMENT PACKAGING SYSTEM

CROSS REFERENCE

This application is related to an application entitled "DETAILED CABLE STRAIN RELIEF CLAMP" by the same inventor which was filed the same day as this application.

BACKGROUND AND SUMMARY OF THE INVENTION

The present invention relates to modularized electronic instrument packaging design. In particular, the present invention relates to an expandable modularized packaging design using a minimum number of different parts.

Miniaturization of packaging is of continuing interest as electronic components become smaller and smaller. It is also a goal in the field of packaging designs to provide modularization so that various sized enclosures can be generated through the use of a minimum number of compatable mechanical components.

In the prior art, the smallest package designs generally are not modularized and thus must be designed to house a particular subsystem. If it is desired to use the same design for a larger subsystem few, if any, of the package components will be usable thus requiring the design and tooling of additional mechanical parts.

A prior art modular packaging system is illustrated in FIG. 3. This system requires a great number of parts, both large and small, to complete the package. Each basic module consists of four corner struts and two box ends to keep the struts in a spaced-apart relationship to each other. Other components (not shown) must then be inserted into the module to support the desired components, e.g. rail assemblies to hold electronic circuit boards in vertical alignment with each other or additional frame work to support heavy electrical components such as transformers or CRTs. In addition, many small fittings and complex interconnection strip assemblies are needed to interconnect one module to another and to attach the side panels to complete the assembly. An assembly like that of FIG. 3 is time intensive to assembly since screws are used to do so, as well as, being tooling intensive as a result of the great number of different parts and part sizes to complete the package.

It is desirable to have a modular packaging system that can be configured to meet a diverse range of packaging sizes with a minimal number of different parts which can be easily and quickly assembled with snap fittings thus reducing the overall costs involved by minimizing the amount of tooling and assembly time required to produce a broad range of package sizes. The present invention provides such a modularized packaging system.

In accordance with the illustrated preferred embodiment, the present invention provides a modularized packaging system for enclosing circuit components of an electronic instrument. That system includes one or more "C" frame modules each having top, bottom and side wall portions interconnected one to the other orthogonally. In addition, there is provided interconnection means for interconnecting, side by side, as many of the "C" frame modules as desired with a side panel provided for closing the outwardly facing open sides, if any, of the outer most "C" frame modules. To complete the package, front and rear end assemblies are provided to close those portions of the interconnected "C" frame modules.

DETAILED DESCRIPTION OF THE PREFERRED EMBODIMENT

Figure 1:
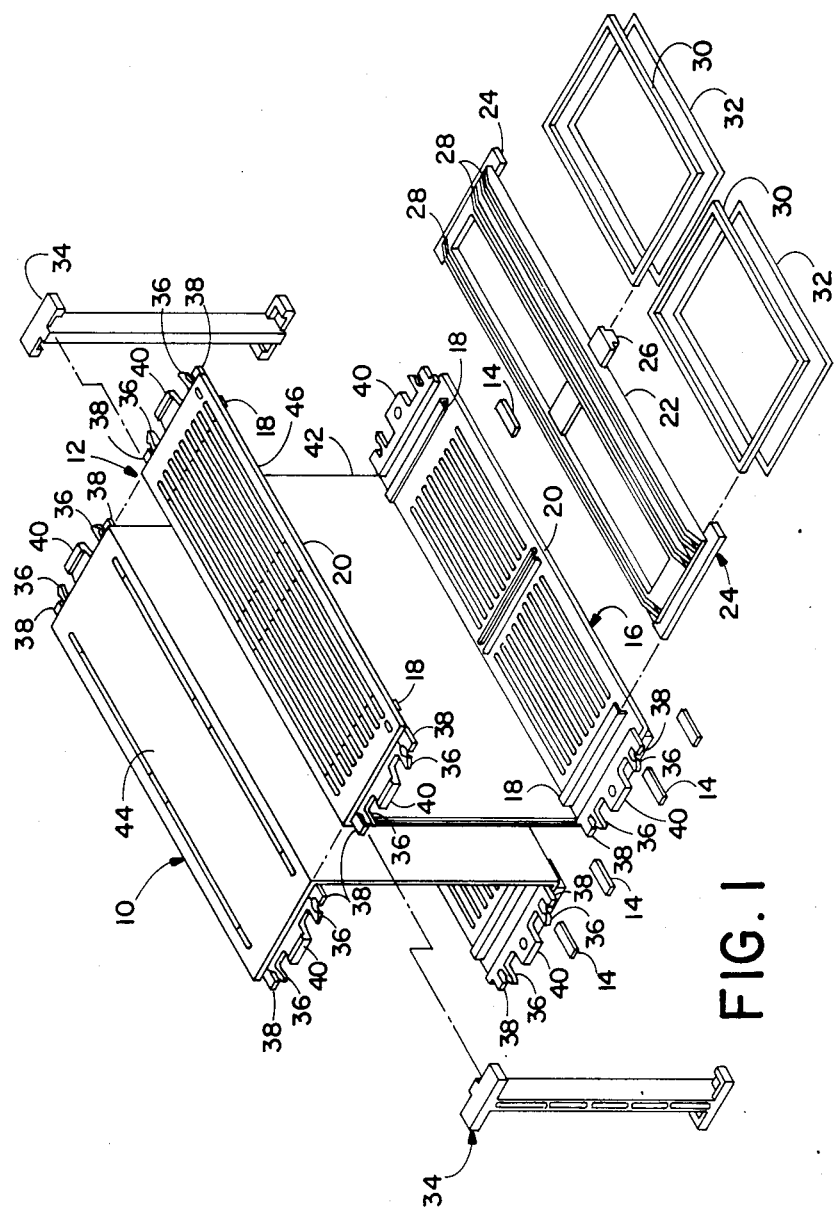
FIG. 1. is an exploded perspective view of the basic interior components of the modularized packaging system of the present invention.

The basic module element of the packaging system of the present invention is a "C" frame of either of the two types shown in FIG. 1. Each of "C" frames 10 and 12 included a solid vertical side wall 42, a ventilated bottom portion 16, and a top portion. "C" frame 10 is shown having a substantially solid top portion 44, while "C" frame 12 is shown with a vented top portion 46. The minimum sized package consists of a single "C" frame with a side panel 56 (see FIG. 2) to close the open side of the "C" of the basic module frame. To minimize assembly time, the "C" frame can be molded as a single unit, however, it could also be manufactured as three separate pieces which are then assembled by any of a variety of methods.

On the inside surface of both the top and bottom portions of each "C" frame are tracks 18 near each end thereof, and a dove tail track 20 in the center thereof, with each of tracks 18 and 20 being perpendicular to the open side of the "C" frame. Tracks 18 and 20 are designed to receive, for example, flanges 24 and dove tail 26, respectively, of a circuit board rail assembly 22. Where circuit boards are to be installed in the package, a rail assembly 22 must be installed on the inside side of both the module bottom and top. Where circuit elements are interconnected other than on circuit boards, other types of platforms (not shown) can be installed within the module in the same way that rail assembly 22 is installed. In addition, where EMI supression is required, EMI filter 30 and EMI screen 32 are disposed to be installed between rail assembly 22 and the module bottom and top.

Two or more "C" frame modules may be mechanically joined by means of a module interconnection clip 34. Clip 34 is of a universal design so that two "C" frame modules can be interconnected in any of three different orientations. Those orientations are wall to wall as shown in FIG. 1, open side to open side, or open side to wall. To accomplish the desired intereconnection of the two modules, a clip 34 is used at both the front and rear of the two modules. Clip 34 is designed to capture a snap finger 36 and alignment tab 38 at the top and bottom of each of the modules being joined. Clip 34 will also capture the edges of wall 43 in those orientations where one or both of the modules has wall 42 at the point of interconnection.

FIG. 1 also shows feet 14 beneath both ends of module bottoms 16 to support the assembled instrument above the surface upon which it is to rest for ventilation through the holes in module bottoms 16.

Figure 2:
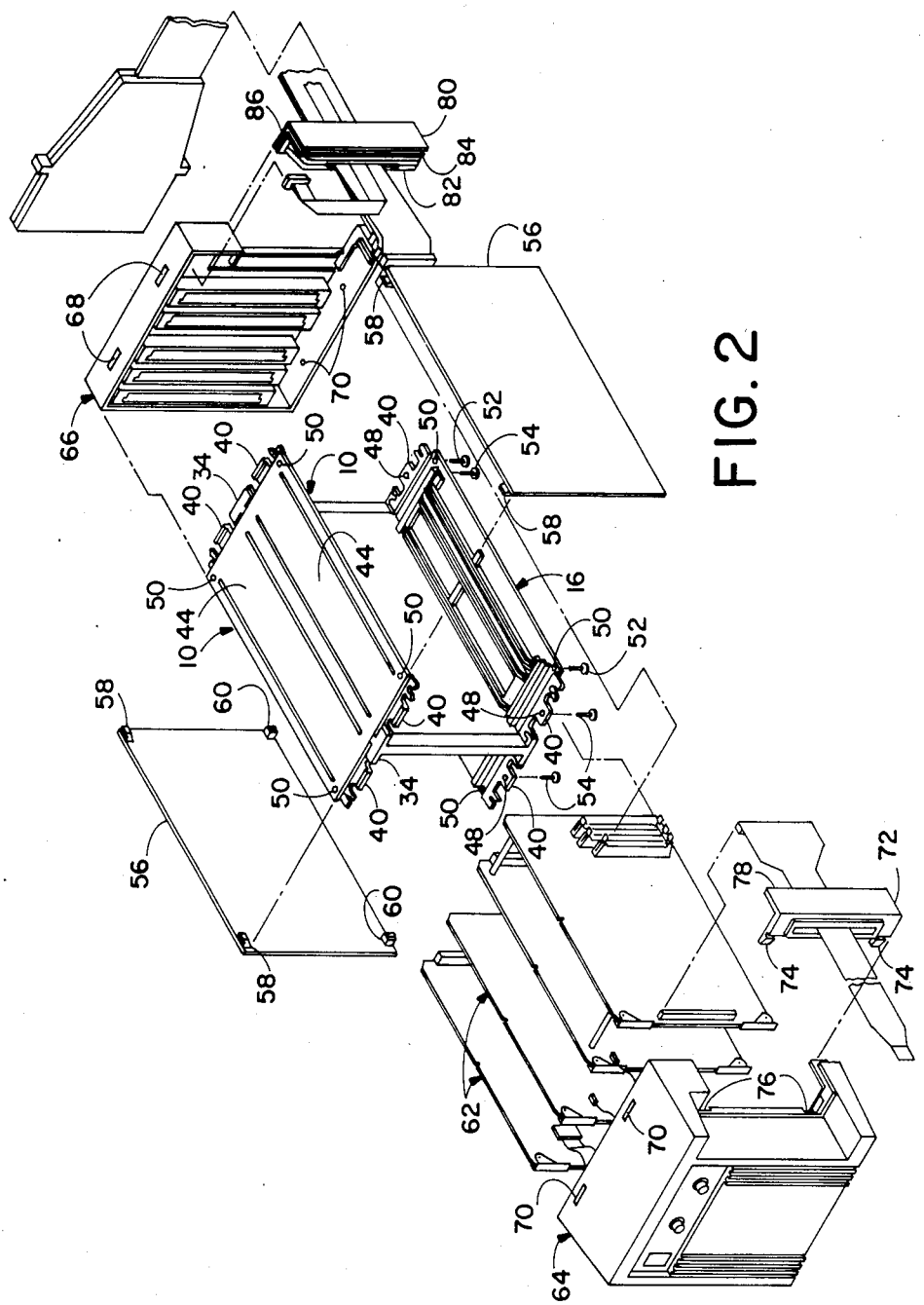
FIG. 2 is an exploded perspective view of the mechanical components for a complete instrument utilizing the modularized packaging system of the present invention incorporating the basic structures shown in FIG. 1.
Figure 3:
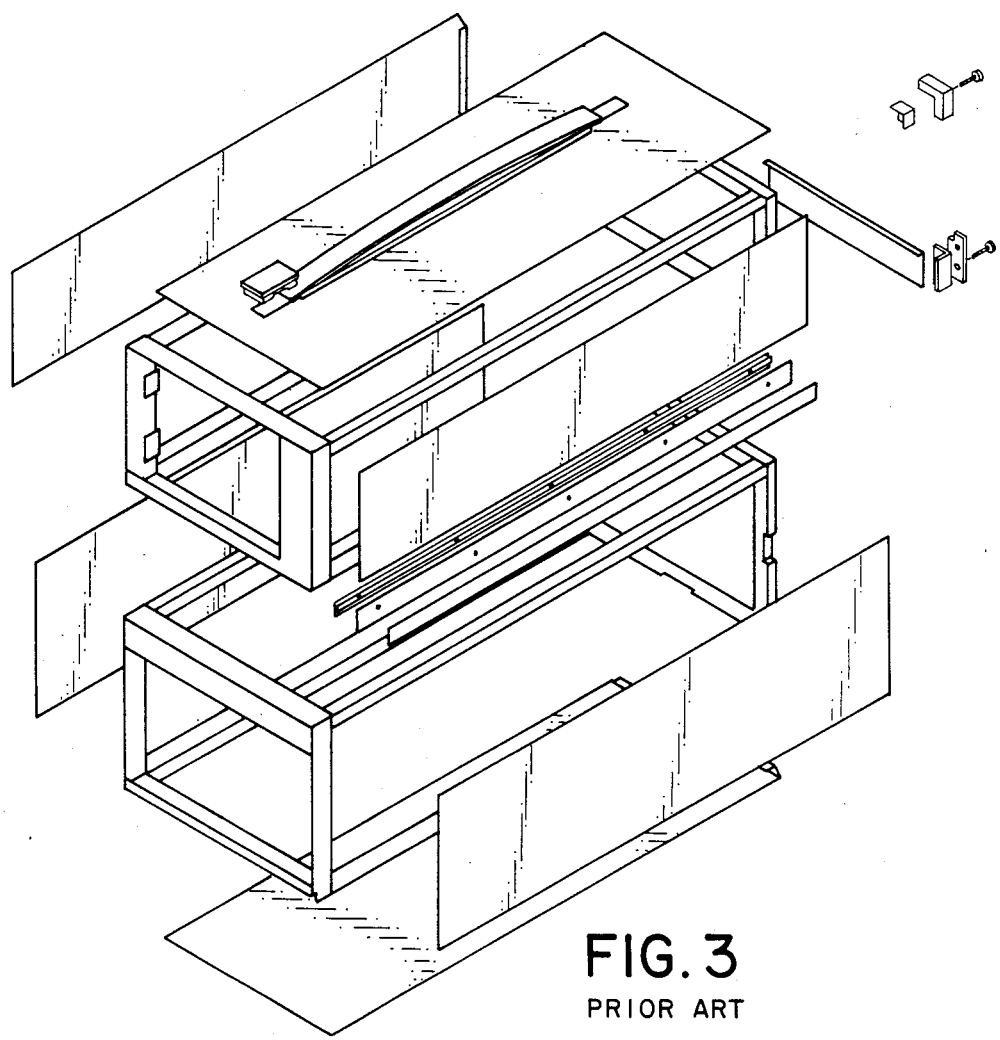
FIG. 3 is an exploded perspective view of a modularized packaging system of the prior art.

To complete the assembly illustrated in FIG. 1, side panels and front and rear assemblies are necessary. Those items are illustrated in FIG. 2. Side panels 56 include fingers 58 near the corners of their top edge and sockets 60 near the corners of their bottom edge. Side panels 56 are mounted to the basic "C" frame module by inserting fingers 58 into holes 50 in the outer corners of the module top from the inside out. Side panel 56 is then closed on the "C" frame module with screws 52 being inserted through holes 50 in the module bottom and extended into sockets 60 along the lower edge of panel 56.

Front end assembly 64 and rear end assembly 66 are designed in a double width since the package illustrated is constructed with two basic modules. They could also each consist of two single width assemblies mounted side by side. Each of the front and rear end assemblies along their top and bottom edges attach to the "C" frame modules by means of tabs 40. The outward extending bead on tabs 40 are received by slots 68 and 70 along the top edge of the rear and front assemblies 66 and 64, respectively. Along the bottom edges, screws 54 are inserted through holes 70 in the bottom edges of rear and front assemblies 66 and 64 and extend into holes 48 in tabs 40 to complete closure with the basic "C" frame modules. In addition, the edge connectors for circuit boards 62 are provided in rear end assembly 66.

Also shown in FIG. 2 are chassis brackets 72 and 80 for providing ports for interconnect cables to pass through the package wall. Chassis bracket 72 is shown with snap fingers 74 which are captured in notches 76 of front end assembly 64 and side panel 56 is mounted outside of flange 78 to keep bracket 72 in place. Chassis bracket 80 attaches to rear end assembly 66 in a different way than bracket 72 attached to the front end assembly. Bracket 80 includes slots 86 along its top and bottom edge which mate with flanges on rear end assembly 66 and a slot 84 which fits around the edge of side panel 56. Also shown in bracket 80 is a strain relief clamp 82 through which the cable passing through the package wall is captured.

A packaging system of the present invention allows package design flexibility since it can be configured to meet a diverse range of instrument product needs. The package is expandable to meet increased product complexity and to adapt to varying product requirements. Additionally, various cooling schemes can be incorporated with the selected package configuration for the specific heat dissipation requirements at minimum cost utilizing either natural or forced convection. Further, the packaging system parts, which in most applications will probably be made of plastic to reduce costs and weight, can be metalized to provide electrical conductivity and to enhance electromagnetic shielding. A packaging system of the present invention has several specific advantages over the prior art, namely, reduced assembly time, the package is built from a smaller number of standard parts, the package design allows the contents to be more easily serviced, the thermal performance of the instrument can be easily optimized, shorter package development times are required due to the flexibility of the packaging system, and common parts are utilized to expand size and configuration.

While this invention has been described in terms of a single embodiment, it is comtemplated that persons reading the preceding descriptions and studying the drawings will realize various alterations and modifications thereof. It is therefore intended that the following apended claims be interpreted as including all such alterations and modifications as fall within the true spirit and scope of the present invention.

What is claimed is:

1. A modularized packaging system cell for enclosing electronic circuit components comprising:
    a "C" frame having a vertical side portion, and top and bottom portions disposed to be affixed substantially perpendicularly along the top and bottom edges of the vertical side portion, respectively, with the top and bottom portions running the full width of the side portion;
    the top and bottom portions including track means on its under and upper surfaces, respectively, extending toward the other of the top and bottom portions parallel to the front and back edges thereof for receiving and capturing circuit platform means from the open side of the frame opposite the vertical side means; and
    circuit platform means for supporting said circuit means within the "C" frame.

2. A modularized packaging system cell as in claim 1 wherein;
    said cell further includes a side plate portion with first fastener means along its top and bottom edges, said side plate portion sized and shaped to close the open side of the "C" frame; and
    said top and bottom portions of the "C" frame further include second fastener means along their edges that are parallel to the vertical side portion thereof for mating with and capturing thereto the side plate portion.

3. A modularized packaging system cell as in claim 1 wherein:
    said top and bottom portions of the "C" frame further include wide fingers extending outward from, and centrally located on, the front and back edges thereof and in the same plane thereas, each of said wide fingers having a bead on its edge furthest from the edge on which it is affixed; and
    said system further includes:
        front end means for closing the front side of the "C" frame; and
        back end means for closing the back side of the "C" frame;
        said front and back side means each define in both their top and bottom edges that are disposed to mate with the front and back sides of the "C" frame a slot sized and shaped to receive the bead on the wide fingers on the top and bottom portions of the "C" frame.

4. A modularized packaging system cell as in claim 1 wherein:
    the track means of the top and bottom portions includes:
        a first track for receiving a dove tail shaped rail, said first track being substantially centered between the front and back edges of each of the top and bottom portions; and
        two pair of "L" shaped tracks, on each on the top and bottom portions, with one of the "L" shaped tracks near the front and back edges of the top and bottom portions, and having the horizontal leg of the "L" parallel to and spaced apart from the surface of the top and bottom portions; and
    said circuit platform means includes a pair of platforms, one for each of the top and bottom portions, between which the circuit elements are to be mounted, each of said platforms includes a dove tail shaped rail substantially in the center of one side parallel to the front and back edges of each platform being disposed to be captured by the first track and a different one of the "L" shaped tracks, respectively, of the corresponding one of the top and bottom portions.

5. A modularized packaging system for enclosing electronic circuit components comprising:
   at least one "C" frame having a vertical side portion, and top and bottom portions disposed to be affixed substantially perpendicularly along the top and bottom edges of the vertical side portion, respectively, with the top and bottom portions running the full width of the side portion;
   each front and back edge, those edges that are perpendicular to the vertical side portion, of both the top and bottom portions of each "C" frame defining snap finger means in the plane of those portions extending outward from each end of the front and back edges;
   the top and bottom portions of each "C" frame including track means on its under and upper surfaces, respectively, extending toward the other of the top and bottom portions parallel to the front and back edges thereof for receiving and capturing circuit platform means from the open side of the frame opposite the vertical side means; and
   circuit platform means for supporting said circuit means within each of the "C" frames.

6. A modularized packaging system as in claim 5 wherein;
   said system further includes a plurality of side plate portions, each with first fastener means along its top and bottom edges, said side plate portions each sized and shaped to close the open side of one "C" frame; and
   said top and bottom portions of the "C" frame further include second fastener means along their edges that are parallel to the vertical side portion thereof for mating with and capturing thereto one side plate portion.

7. A modularized packaging system as in claim 5 further includes:
   interconnection means for interconnecting, side by side, at least two "C" frames
   each of said "C" frames with the open side of one opposite the open side of another, with the vertical side portion of one opposite the open side of another, or with the vertical side portion of one juxtaposed the vertical side portion of another.

8. A modularized packaging system as in claim 7 wherein said interconnection means includes
   clip means disposed to couple with the snap finger means on each of two adjacent "C" frames disposed to be interconnected.

9. A modularized packaging system as in claim 7 wherein;
   said system further includes a plurality of side plate portions, each with first fastener means along its top and bottom edges, said side plate portions each sized and shaped to close the open side of one "C" frame; and
   said top and bottom portions of the "C" frame further include second fastener means along their edges that are parallel to the vertical side portion thereof for mating with and capturing thereto one side plate portion.

10. A modularized packaging system as in claim 5 wherein:
    said top and bottom portions of each "C" frame further include wide fingers extending outward from, and centrally located on, the front and back edges thereof and in the same plane thereas, each of said wide fingers having a bead on its edge furthest from the edge on which it is affixed; and
    said system further includes:
    front end means for closing the front side of said at least one "C" frame; and
    back end means for closing the front side of said at least one "C" frame;
    said front and back side means each define in both their top and bottom edges that are disposed to mate with the front and back sides of said at least one "C" frame a slot sized and shaped to receive the bead on the wide fingers on the top and bottom portions of each of said at least one "C" frame.

11. A modularized packaging system as in claim 5 wherein:
    the track means of each of the top and bottom portions includes:
    a first track for receiving a dove tail shaped rail, said first track being substantially centered between the front and back edges of each of the top and bottom portions; and
    two pair of "L" shaped tracks, one each on the top and bottom portions, with one of the "L" shaped tracks near the front and back edges of the top and bottom portions, and having the horizontal leg of the "L" parallel to and spaced apart from the surface of the top and bottom portions; and
    said circuit platform means includes a pair of platforms for each "C" frame, one each for the top and bottom portions, between which the circuit elements are to be mounted, each platform includes a dove tail shaped rail substantially in the center of one side parallel to the front and back edges thereof, said dove tail shaped rail and the front and back edges of each platform being disposed to be captured by the first track and a different one of the "L" shaped tracks, respectively, of the corresponding one of the top and bottom portions.

12. A modularized packaging system as in claim 7 wherein:
    the track means of each of the top and bottom portions includes:
    a first track for receiving a dove tail shaped rail, said first track being substantially centered between the front and back edges of each of the top and bottom portions; and
    two pair of "L" shaped tracks, one each on the top and bottom portions, with one of the "L" shaped tracks near the front and back edges of the top and bottom portions, and having the horizontal leg of the "L" parallel to and spaced apart from the surface of the top and bottom portions; and
    said circuit platform means includes a pair of platforms for each "C" frame, one each for the top and bottom portions, between which the circuit elements are to be mounted, each platform includes a dove tail shaped rail substantially in the center of one side parallel to the front and back edges thereof, said dove tail shaped rail and the front and back edges of each platform being disposed to be captured by the first track and a different one of the "L" shaped tracks, respectively, of the corresponding one of the top and bottom portions.

13. A modularized packing system as in claim 10 wherein said front and back end means are as wide as the combined front and back ends, respectively, of the "C" frames disposed to be interconnected.

* * * * *